(12) United States Patent
Yang

(10) Patent No.: US 7,800,150 B2
(45) Date of Patent: Sep. 21, 2010

(54) SEMICONDUCTOR DEVICE

(75) Inventor: Chin-Sheng Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 148 days.

(21) Appl. No.: 11/754,829

(22) Filed: May 29, 2007

(65) Prior Publication Data
US 2008/0296695 A1 Dec. 4, 2008

(51) Int. Cl.
*H01L 27/108* (2006.01)

(52) U.S. Cl. .............................. 257/295; 247/E21.239; 247/E21.293

(58) Field of Classification Search .................. 257/295, 257/E21.239, 21.293, E21.293
See application file for complete search history.

(56) References Cited

U.S. PATENT DOCUMENTS

| | | | |
|---|---|---|---|
| 5,847,419 A * | 12/1998 | Imai et al. .................... | 257/192 |
| 6,190,975 B1 * | 2/2001 | Kubo et al. ................... | 438/285 |
| 6,339,970 B1 * | 1/2002 | Blex ............................. | 74/492 |
| 7,041,576 B2 * | 5/2006 | Pozder et al. ................ | 438/458 |
| 7,329,571 B2 * | 2/2008 | Hoentschel et al. .......... | 438/199 |
| 7,384,861 B2 * | 6/2008 | Mehta et al. ................. | 438/524 |
| 7,399,663 B2 * | 7/2008 | Hoentschel et al. .......... | 438/151 |
| 2007/0015347 A1 * | 1/2007 | Mehta et al. ................. | 438/514 |

* cited by examiner

*Primary Examiner*—Howard Weiss
*Assistant Examiner*—Steven H Rao
(74) *Attorney, Agent, or Firm*—WPAT, PC; Justin King

(57) ABSTRACT

A semiconductor is provided. The semiconductor device includes a transistor, a first strain layer and a second strain layer on a substrate. The first strain layer is configured at the periphery of the transistor. The second strain layer covers the transistor and a region exposed by the first strain layer. The stress provided by the second strain layer is different from that by the first strain layer.

28 Claims, 7 Drawing Sheets

SEMICONDUCTOR DEVICE

BACKGROUND OF THE INVENTION

1. Field of Invention

The present invention relates to an integrated circuit and a method of fabricating the same; more particularly, the present invention relates to a semiconductor device and a method of fabricating the same.

2. Description of Related Art

With the development of technology in electronic equipments for communication, etc., the operating speed of a transistor increases rapidly. However, limited by the mobility of electrons and holes in the silicon channel, the area of application of a transistor is limited.

Altering the mobility of electrons and holes in the channel by controlling the mechanical stress in the channel is one approach to enhance the operational speed of a transistor.

Conventionally, the silicon germanium (SiGe) type of material has been proposed for forming the source/drain regions of the transistor, wherein portions of the substrate designated for forming the source/drain regions are removed. Thereafter, a selective area epitaxial growth technique is applied to fill the substrate with silicon germanium. Since germanium has a larger atom size to impose a compressive stress to the channel, using a silicon germanium material for the source/drain regions enhances the mobility of holes, when compared with a silicon material. Another approach is by using silicon nitride as a contact etching stop layer (CESL) to generate stress for influencing the driving current of the transistor. As a result, the efficiency of the device is increased. This technique is known as local mechanical-stress control.

According to the typical local mechanical-stress control method, a strain layer is applied to cover the transistor and it's peripheral. For example, in a complementary metal oxide semiconductor device, a tensile film is normally applied to cover the n-type channel metal oxide semiconductor device region, while a compressive film is applied to cover the p-type channel metal oxide semiconductor device region. However, the increase of the driving current by a single strain layer is very limited. Hence, to enhance the efficiency of the device becomes restricted.

SUMMARY OF THE INVENTION

The present invention is to provide a semiconductor device and a fabrication method thereof, wherein the local mechanical stress is effectively increased to raise the driving current and to enhance of the efficiency of the device.

The present invention is to provide a semiconductor device, wherein the device includes a transistor, a strain auxiliary layer and a strain layer. The transistor is configured on a substrate; the strain auxiliary layer is configured on the substrate at the peripheral of the transistor; the strain layer covers the transistor and the substrate not covered by the strain auxiliary layer. Further, the strain layer and the strain auxiliary layer provide different types of stress.

In accordance to the semiconductor device of an embodiment of the invention, the strain auxiliary layer includes two sections correspondingly configured on the substrate at the peripheral of the transistor.

In accordance to the semiconductor device of an embodiment of the invention, wherein the two sections of the strain auxiliary layer correspondingly configured above the substrate of a part of the isolation region.

In accordance to the semiconductor device of an embodiment of the invention, the strain auxiliary layer includes two sections respectively configured in proximity to two source/drain regions of the transistor.

In accordance to the semiconductor device of an embodiment of the invention, wherein the two sections of the strain auxiliary layer correspondingly respectively delineated at each source/drain region of the transistor, wherein the one side of each source/drain region is substantially parallel to an extension direction of a gate of the transistor.

In accordance to the semiconductor device of an embodiment of the invention, wherein one of the two sections of the strain auxiliary layer cover a part of the common source/drain regions of the transistor; the other one of two sections of the strain auxiliary layer is configured above a part of the isolation region of the substrate.

According to the semiconductor device of an embodiment of the invention, the other one of the two sections of the strain auxiliary layer is delineated extending along one side of a source/drain region of the transistor, wherein the one side of the source/drain region is substantially parallel to an extension direction of a gate of the transistor.

According to the semiconductor device of an embodiment of the invention, the strain auxiliary layer has a ring-like configuration encircling the periphery of the transistor. The strain auxiliary layer includes the above two sections and two connecting parts to connect the two sections.

According to the semiconductor device of an embodiment of the invention, the two sections of the ring-like configuration of the strain auxiliary layer delineate extend along a side of a source/drain region of the transistor, wherein the side of the source/drain is substantially parallel to the extension direction of the gate.

According to the semiconductor device of an embodiment of the invention, the stress provided by the strain layer is opposite to that provided by the strain auxiliary layer.

According to the semiconductor device of an embodiment of the invention, wherein the transistor is an N-type channel metal oxide transistor, and the strain auxiliary layer is a tensile film layer, while the strain layer is a compressive film layer.

According to the semiconductor device of an embodiment of the invention, wherein the transistor is a P-type channel metal oxide transistor, and the strain auxiliary layer is a compressive film layer, while the strain layer is a tensile film layer.

The present invention provides a semiconductor device including a first conductive type channel metal oxide semiconductor transistor, a second conductive type channel metal oxide semiconductor transistor, a first strain layer and a second strain layer disposed on a substrate. The substrate includes a first conductive type well region and a second conductive type well region. The first conductive type channel metal oxide semiconductor transistor is configured in the second conductive type well region; the second conductive type channel metal oxide semiconductor transistor is configured in the first conductive type well region. The first strain layer is configured over a part of the first conductive type well region and a part of the second conductive type well region; the second strain layer is configured over another part of the first conductive type well region not covered by the first strain layer and another part of the second conductive type well region not covered by the first strain layer. Further, the second strain layer and the first strain layer provide different types of stress.

According to the semiconductor device of an embodiment of the invention, wherein the second strain layer and the first strain layer provide opposite type of stress.

According to the semiconductor device of an embodiment of the invention, wherein the first conductive type includes N-type, while the second conductive type includes P-type.

According to the semiconductor device of an embodiment of the invention, wherein the first strain layer includes a tensile film layer, while the second strain layer includes a compressive film layer.

According to the semiconductor device of an embodiment of the invention, wherein a part of the first strain layer configured on the first conductive type welt region is positioned on a periphery of the second conductive channel metal oxide semiconductor transistor.

According to the semiconductor device of an embodiment of the invention, wherein the first strain layer configured on part of the first conductive type well region includes two sections, correspondingly disposed on the substrate.

According to the semiconductor device of an embodiment of the invention, wherein the two sections of the first strain layer are disposed on the part of the isolation region in the substrate.

According to the semiconductor device of an embodiment of the invention, wherein the two sections of the second strain layer are respectively in close proximity to two source/drain regions of the first conductive type channel metal oxide semiconductor transistor.

According to the semiconductor device of an embodiment of the invention, wherein the two sections of the first strain layer are correspondingly respectively disposed at a side of each source/drain region of the first conductive type channel metal oxide semiconductor transistor wherein the side of each source/drain regions is substantially parallel to the extension direction of the gate of the first conductive type channel metal oxide semiconductor transistor.

According to the semiconductor device of an embodiment of the invention, wherein one of the two sections of the first strain layer covers a common source/drain region of a part of the first conductive type channel metal oxide semiconductor transistor, while the other one of the two sections of the first strain layer covers a part of the isolation region.

According to the semiconductor device of an embodiment of the invention, wherein the first strain layer on the second conductive type well region has a ring-like configuration encircling the periphery of the first conductive type channel metal oxide semiconductor transistor, wherein the ring like configuration of the first strain layer includes the above two sections and two connecting parts for connecting the above two sections.

According to the semiconductor device of an embodiment of the invention, wherein a part of the second strain layer disposed on the first conductive type well region is configured on periphery of the second conductive channel metal oxide semiconductor transistor.

According to the semiconductor device of an embodiment of the invention, wherein the second strain layer configured on the first conductive type well region includes two sections that are correspondingly disposed on the substrate.

According to the semiconductor device of an embodiment of the invention, wherein the two sections of the second strain layer are both disposed on a part of the isolation region.

According to the semiconductor device of an embodiment of the invention, wherein the two sections of the second strain layer are respectively in proximity to two source/drain regions of the second conductive type channel metal oxide semiconductor transistor.

According to the semiconductor device of an embodiment of the invention, wherein the two sections of the second strain layer are correspondingly respectively delineated at a side of each source/drain region of the second conductive type channel metal oxide semiconductor transistor, wherein the side of each source/drain region that is substantially parallel to an extension direction of a gate of the second conductive type channel metal oxide semiconductor transistor.

According to the semiconductor device of an embodiment of the invention, wherein one of the two sections of the first strain layer covers a part of the common source/drain region of the second conductive type channel metal oxide semiconductor transistor, while the other one of the two sections of the first strain layer covers a part of a isolation region in the substrate.

According to the semiconductor device of an embodiment of the invention, wherein the second strain layer on the first conductive type well region may have ring-like configuration which includes the above two sections and two connecting parts for connecting the above two sections, to encircle the periphery of the second conductive type channel metal oxide semiconductor transistor.

The present invention provides a fabrication method of a semiconductor device. The method includes forming a transistor on a substrate. A strain auxiliary layer is formed on a part of the substrate at a periphery of the transistor. A strain layer is form on the substrate to cover the transistor and another part of the substrate not covered by the strain auxiliary layer.

According to the semiconductor device of an embodiment of the invention, the strain layer and the strain auxiliary layer provide opposite types of stress.

According to the semiconductor device of an embodiment of the invention, wherein the transistor is a N-type channel metal oxide transistor, and the strain auxiliary layer is a tensile film layer, while the strain layer is a compressive film layer.

According to the semiconductor device of an embodiment of the invention, wherein the transistor is a P-type channel metal oxide transistor, and the strain auxiliary layer is a compressive film layer, while the strain layer is a tensile film layer.

According to the semiconductor device of an embodiment of the invention, wherein the fabrication of the strain auxiliary layer is conducted before the fabrication of the strain layer.

According to the semiconductor device of an embodiment of the invention, wherein the fabrication of the strain layer is conducted before the fabrication of the strain auxiliary layer.

The present invention provides a fabrication method of a semiconductor device. The method includes forming a first conductive well region and a second conductive well region in a substrate. A second conductive type channel metal oxide semiconductor transistor is formed in the first conductive type well region and a first conductive type channel metal oxide semiconductor transistor is formed in the second conductive type well region. Thereafter, a first strain layer is formed on a part of the first conductive type well region and on a part of the first conductive type well region, while a second strain layer is formed on a part of the first conductive type well region not covered by the first strain layer and on a part of the second conductive type well region not covered by the first strain layer, wherein the second strain layer and the first strain layer provide different types of stress.

According to the semiconductor device of an embodiment of the invention, wherein the second strain layer and the first strain layer provide opposite types of stress.

According to the semiconductor device of an embodiment of the invention, wherein the first conductive type includes N-type, while the second conductive type includes P-type.

According to the semiconductor device of an embodiment of the invention, wherein the first strain layer includes a tensile film layer, while the second strain layer includes a compressive film layer.

According to the semiconductor device of an embodiment of the invention, wherein the fabrication of the strain auxiliary layer is conducted before the fabrication of the strain layer.

According to the semiconductor device of an embodiment of the invention, wherein the fabrication of the strain layer is conducted before the fabrication of the strain auxiliary layer.

In accordance to the fabrication method of the invention, asides form fabricating a strain layer at the periphery of the transistor, a strain auxiliary layer is also formed to enhance the stress being provided by the strain layer. Hence, the local mechanical stress is effectively increased to raise the driving current and to enhance to efficiency of the device.

Moreover, in accordance to the invention, the local mechanical stress can be effectively increased without complicating the fabrication process.

In order to make the aforementioned and other objects, features and advantages of the present invention comprehensible, a preferred embodiment accompanied with figures is described in detail below.

DESCRIPTION OF EMBODIMENTS

Figure 1:
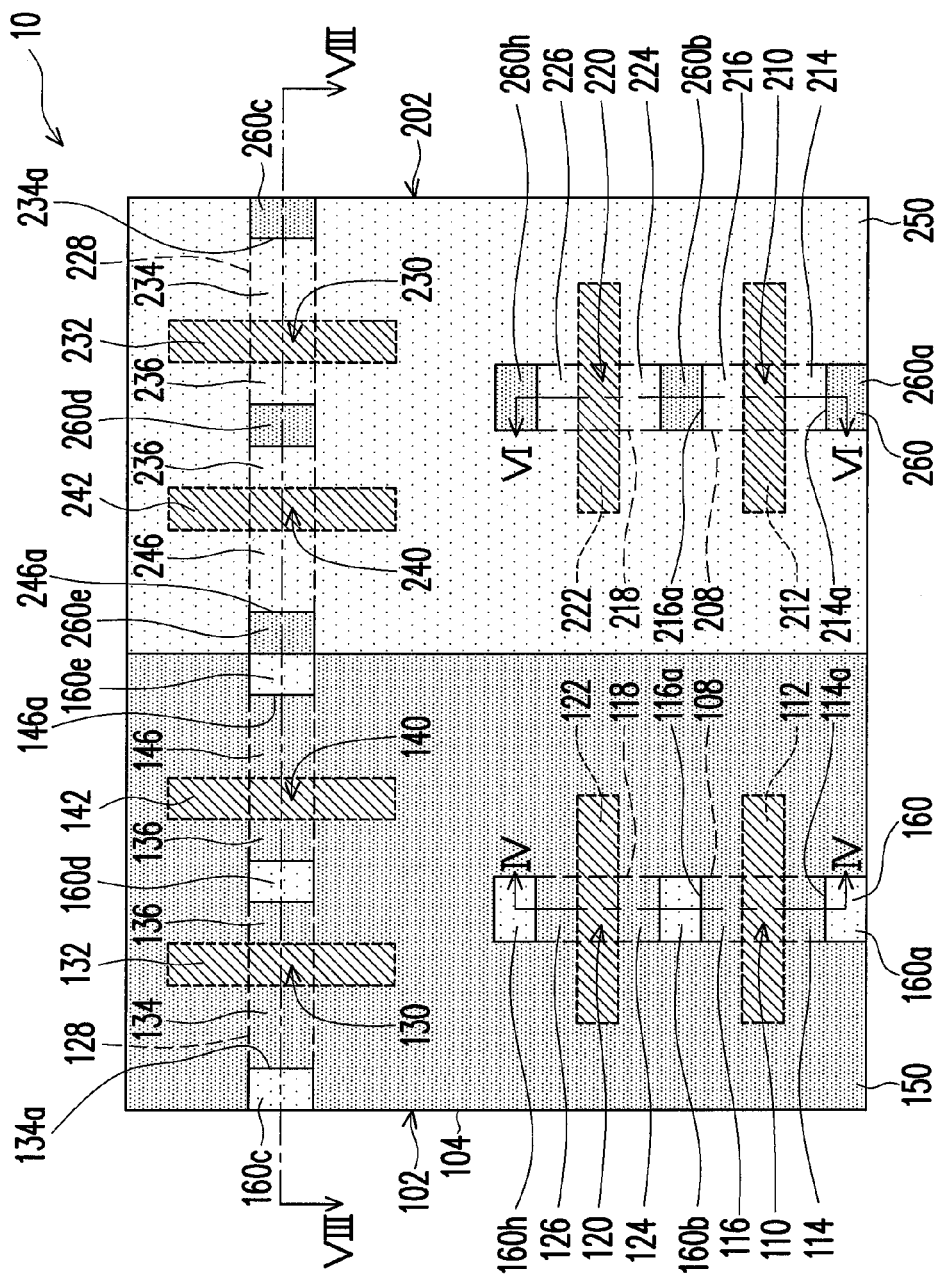
FIG. 1 is a schematic, top-view diagram of a semiconductor device according to one embodiment of the present invention.
Figure 2:
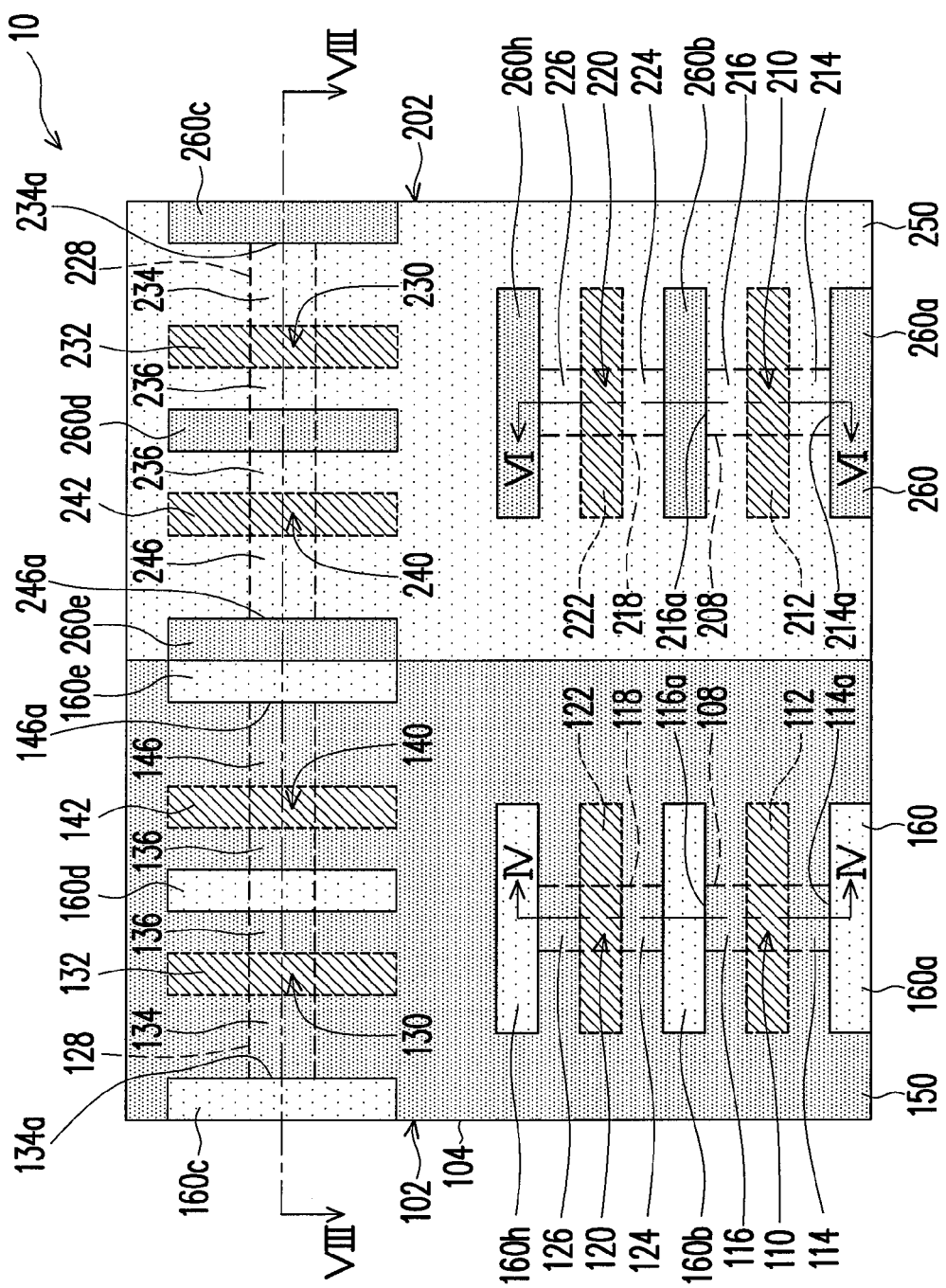
FIG. 2 is a schematic, top-view diagram of a semiconductor device according to another embodiment of the present invention.
Figure 3:
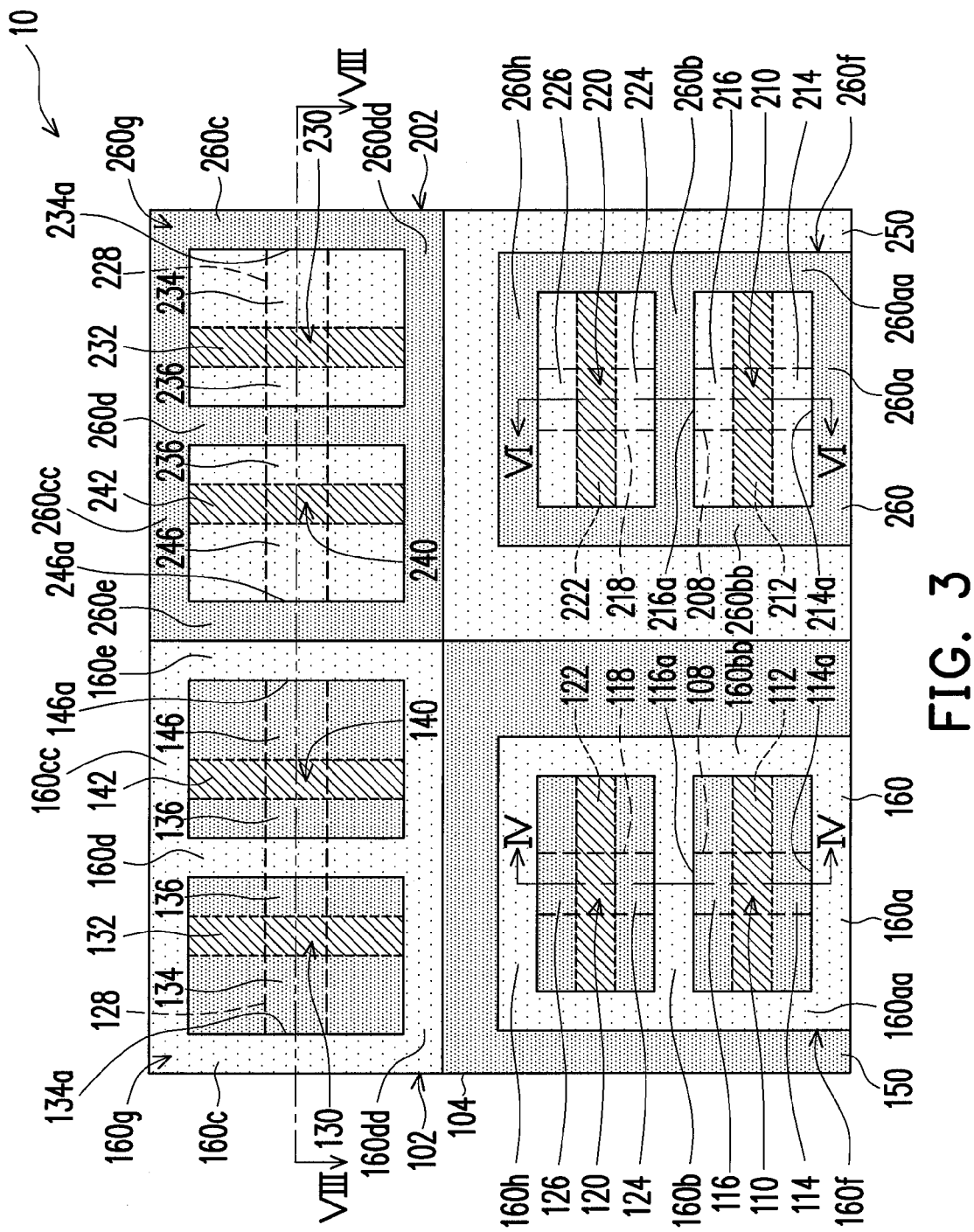
FIG. 3 is a schematic, top-view diagram of a semiconductor device according to yet another embodiment of the present invention.

FIG. 1 is a schematic, upper-view, diagram of a semiconductor device according to one embodiment of the invention. FIG. 2 is a schematic, top-view diagram of a semiconductor device according to another embodiment of the present invention. FIG. 3 is a schematic, top-view diagram of a semiconductor device according to yet another embodiment of the present invention.

Referring to FIG. 1 or 2, a semiconductor device 10 of the present invention is formed on the substrate 100. The substrate 100 is, for example, a semiconductor substrate, such as a silicon substrate. The silicon substrate includes n-type dopants or p-type dopants therein. The n-type dopants include but not limited to phosphorous or arsenic. The p-type dopants include boron, for example. The substrate 100 may also be silicon-on-isolator (SOI), which includes an insulation layer having a silicon substrate thereover. The substrate includes an n-type well region 102 and a p-type well region 202. The n-type well region 102 is also know as a PMOS device region; while the p-type well region 104 is also know as an NMOS device region.

Figure 4:
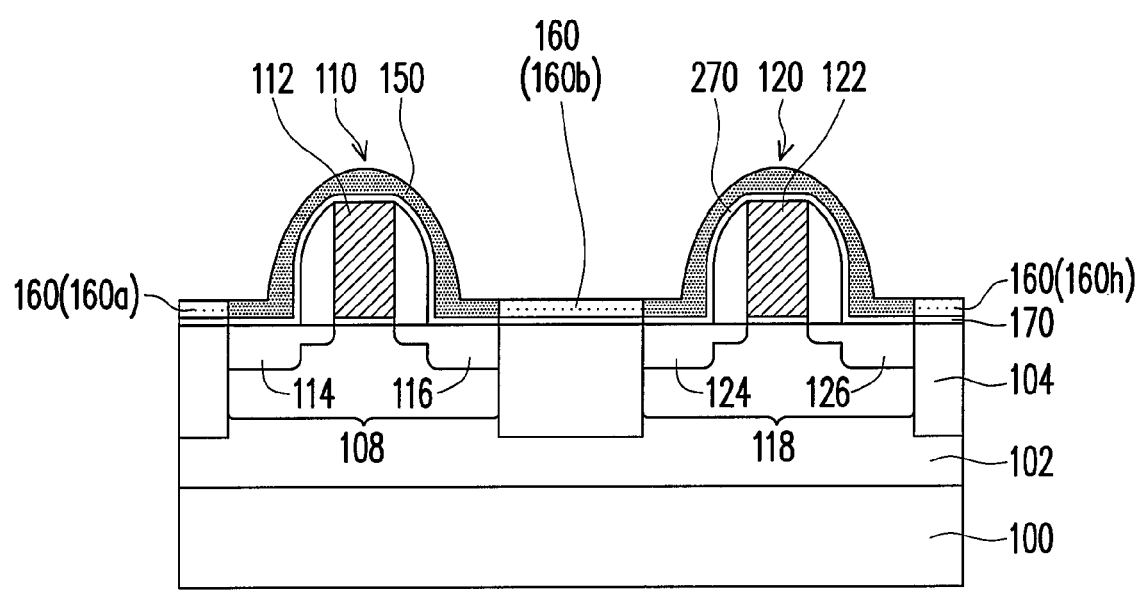
FIG. 4 is a schematic, cross-sectional diagram of FIG. 1, 2 or 3 along the line IV-IV.

FIG. 4 is a schematic, cross-sectional diagram of FIG. 1, 2 or 3 along the line IV-IV.

Referring concurrently to FIG. 2 and FIG. 4, in the n-type well region 102, an isolation structure 104 is used to define the active regions 108, 118 and 128. The isolation structure 104 is shallow trench isolation structures, for example. The neighboring active regions 108 and 118, which are respectively formed with transistors 110, 120 thereon, are isolated by the isolation region 104 Two neighboring transistors 130 and 140 are formed on the active region 128.

Referring concurrently to FIG. 2 and FIG. 4, the transistor 110 is, for example, a p-type channel metal oxide semiconductor transistor (PMOS). The transistor 110 includes a gate 112 and source/drain regions 114, 116. The gate 112 is configured on the active region 108 and extends to the isolation region 104 at the periphery of the active region 108. The gate 112 is constructed with a gate dielectric layer and a gate conductive layer. The source/drain regions 114, 116 are configured in the active region 108 beside two sides of the gate 112. The source/drain regions 114, 116 are formed with a p-type doped region in the substrate 100, for example or by a p-type doped semiconductor compound layer.

Referring concurrently to FIGS. 2 and 4, the neighboring transistors 120 and 110 are configured on different active regions. The transistor 120 is, for example, a p-type channel metal oxide semiconductor transistor. The transistor 120 includes a gate 122 and source/drain regions 124, 126. The gate 122 is positioned on the active region 118 and extends to the isolation region 104 at the peripheral of the active region 118. The source/drain regions 124, 126 are formed with a p-type doped region in the substrate 100, for example or with a p-type doped semiconductor compound layer.

Referring to FIGS. 2 and 4 concurrently, the transistors 130, 140 are, for example, p-type channel metal oxide semiconductor transistors. The transistor 130 and the transistor 140 are configured on a same active region 128, sharing a common source/drain region 136. The transistor 130 includes a gate 132, a source/drain region 134 and the common source/drain region 136. The gate 132 is positioned on the active region 128 and extends to the isolation region 104 at the peripheral of the active region 118. The gate 132 is constituted with a gate dielectric layer and a gate conductive layer. The source/drain region 134 and the common source/drain region 136 are configured in the active region 128 beside two sides of the gate 132. The source/drain region 134 and the common source/drain region 136 are formed with a p-type doped region in the substrate 100, for example, or with a p-type doped semiconductor compound layer.

Referring to FIGS. 2 and 4 concurrently, the transistor 140 includes a gate 142, a source/drain region 146 and the common source/drain region 136. The gate 142 is positioned on the active region 128 and extends to the isolation region 104 at the peripheral of the active region 128. The gate 142 is constituted with a gate dielectric layer and a gate conductive layer. The source/drain region 146 and the common source/drain region 136 are configured in the active region 128 beside two sides of the gate 142. The source/drain region 146 and the common source/drain region 136 are formed with a p-type doped region in the substrate 100, for example, or with a p-type doped semiconductor compound layer.

Referring concurrently to FIGS. 2 and 4, the gate dielectric layer of each of the above transistors 110, 120, 130, 140 includes a silicon oxide layer or other dielectric material. The gate conductive layer is constructed with a doped polysilicon layer, for example, or with doped polysilicon and a silicide layer. The metal silicide layer includes heat tolerant metal such as, nickel, cobalt, titanium, copper, molybdenum, tantalum, tungsten, zirconium, platinum and alloys of these metals.

In one embodiment, the above source/drain regions 114, 116, 124, 126, 134, 146 and the common source/drain region 136 are p-type doped regions in the substrate 100, which are fabricated by, for example forming a patterned photoresist layer (not shown) over the substrate 100, followed by performing an ion implantation process. The dopants being implanted in the ion implantation process include p-type dopants, such as boron.

In another embodiment, the above source/drain regions 114, 116, 124, 126, 134, 136 and the common source/drain region 136 are p-type doped semiconductor compound layer formed in the substrate 100. The p-type doped semiconductor compound layer is fabricated by, for example, forming a patterned photoresist layer in the substrate 100, and removing the substrate 100 at two sides of the gates 112, 122, 132, 142 to form a pit (not shown), followed by performing a selective area epitaxy growth process to epitaxially grow a semiconductor compound layer in the pit and doping the semiconductor compound layer. The semiconductor compound includes silicon germanium. Silicon germanium is formed by introducing a silicon containing gas source, for example, silane or dichloromethane ($CH_2Cl_2$) or a mixture thereof, a germanium gas source, for example, germane-containing gas ($GeH_4$), hydrogen chloride (HCl) and a doped gas source such as borane gas ($BH_3$) as the reacting gas source, into a chemical vapor deposition reaction chamber operated at a temperature of 700 to 900 degrees Celsius and depositing for about 3 to 4 hours. During the deposition, p-type dopants, for example, boron can be doped in-situ to form the source/drain regions 114, 116, 124, 126, 134, 146 and the common source/drain region 136.

In one embodiment, the above source/drain regions 114, 116, 124, 126, 134, 146 and the common source/drain region 136 may further include a metal silicide layer (not shown) thereon. The silicide layer includes heat tolerant metal such as, nickel, cobalt, titanium, copper, molybdenum, tantalum, tungsten, zirconium, platinum and alloys of these metals.

Referring concurrently to FIGS. 2 and 4, the n-type well region 102 includes a compressive film layer 150 and a strain auxiliary layer 160. The compressive film layer 150 covers the transistors 110, 120, 130, 140 and a majority of the isolation structure 104 to provide a compressive stress to each transistor 110, 120, 130 and 140 for enhancing the mobility of electrons and holes in the channel and to increase the operating speed of the transistor. The type of stress provided by the strain auxiliary layer 160 is different from that provided by the compressive film layer 150. The strain auxiliary layer 160 covers a small portion of the isolation structure 104 to increase the compressive stress provided by the compressive film layer 150. In one embodiment, the type of stress provided by the strain auxiliary layer 140 is opposite to that of the compressive film layer 150; for example, the strain auxiliary layer 140 is a tensile film layer, which can provide a tensile push force to the compressive film layer 150 to enhance the compressive stress provided by the compressive film layer 150.

Referring to FIGS. 1 and 2, in one embodiment, using the transistor 110 on the active region 108 as an exemplary illustration, the strain auxiliary layer 160 includes two sections 160a, 160b, which are correspondingly disposed above the isolation region 104 in proximity to the source/drain regions 114, 116 at the sides 114a, 116a of the source/drain regions 114, 116 that are substantially parallel to the extension direction of the gates 132, 142. The two sections 160a, 160b of the strain auxiliary layer 160 may have block-like configurations disposed above the isolation region 104 near the source/drain regions 114, 116 as shown in FIG. 1 or long-strip configurations extend substantially parallel to the gate 112 as shown in FIG. 2. The compressive film layer 150 covers on the transistor 110 and the isolation region 104 not covered by the two sections 160a, 160b strain auxiliary layer. The two sections 160a, 160b of the strain auxiliary layer 160 can be designed into different sizes, shapes, and can be symmetrical or asymmetrical according the stress required by the entire device.

Using the transistors 130, 140 on the active region 128 as an exemplary illustration, the strain auxiliary layer 160 includes three sections 160c, 160d, 160e, wherein the sections 160c and 160e are correspondingly disposed on the isolation region 104 in proximity to the source/drain regions 134, 146 and are respectively disposed at the one side 134a, 146a of the source/drain regions 134, 146 that is substantially parallel to the extension direction of the gates 132, 142. The part 160d covers a part of the commons source/drain region 136 of the transistors 130, 140. The compressive film layer 150 covers the gates 132, 142 of the transistors 130, 140, the source/drain regions 134, 146, a part of the common source/drain region 146 and the isolation region 104 not covered by the strain auxiliary layers 160c, 160d, 160e. The sections 160c and 160e may have block-like configurations disposed above the isolation region 140 near the source/drain regions 134, 146, as shown in FIG. 1 or long-strip configurations that extend substantially parallel to the gates 132, 142 as shown in FIG. 2. The part 160d may have a block-like configuration and covers a part of the common source/drain region 136 of the transistors 130, 140 as shown in FIG. 1 or a long-strip configuration that extends substantially parallel to the gates 132, 142 as shown in FIG. 2. The three sections of the strain auxiliary layer 160 can be designed into various sizes, shapes, and can be symmetrical or asymmetrical according the stress required by the entire device.

Figure 7:
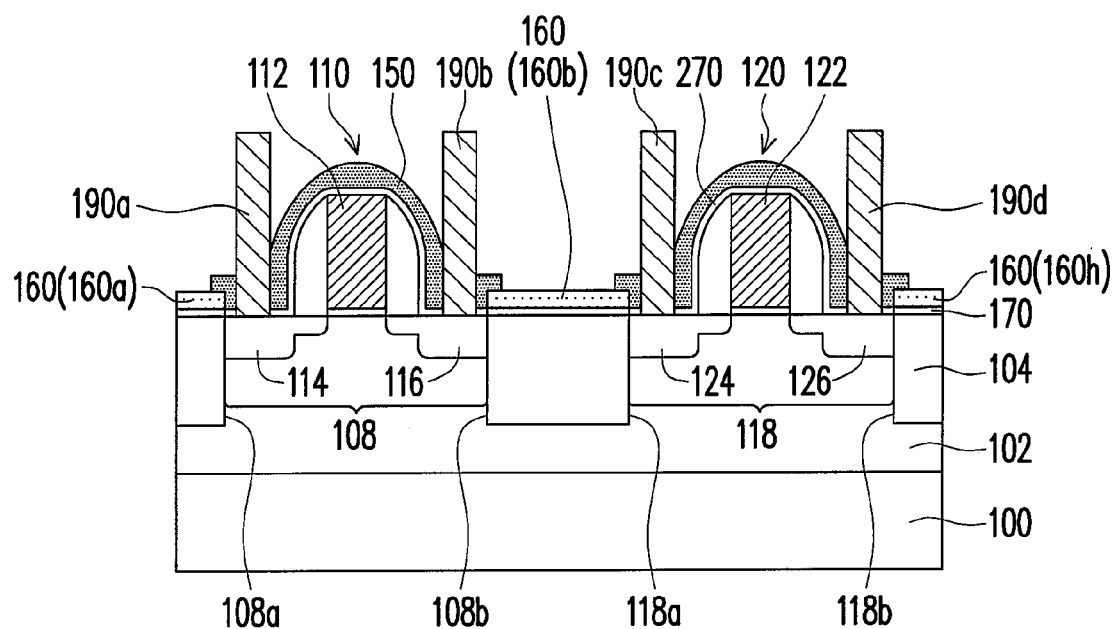
FIG. 7 is a schematic, cross-sectional diagram of FIG. 1, 2 or 3 along the line IV-IV.
Figure 8:
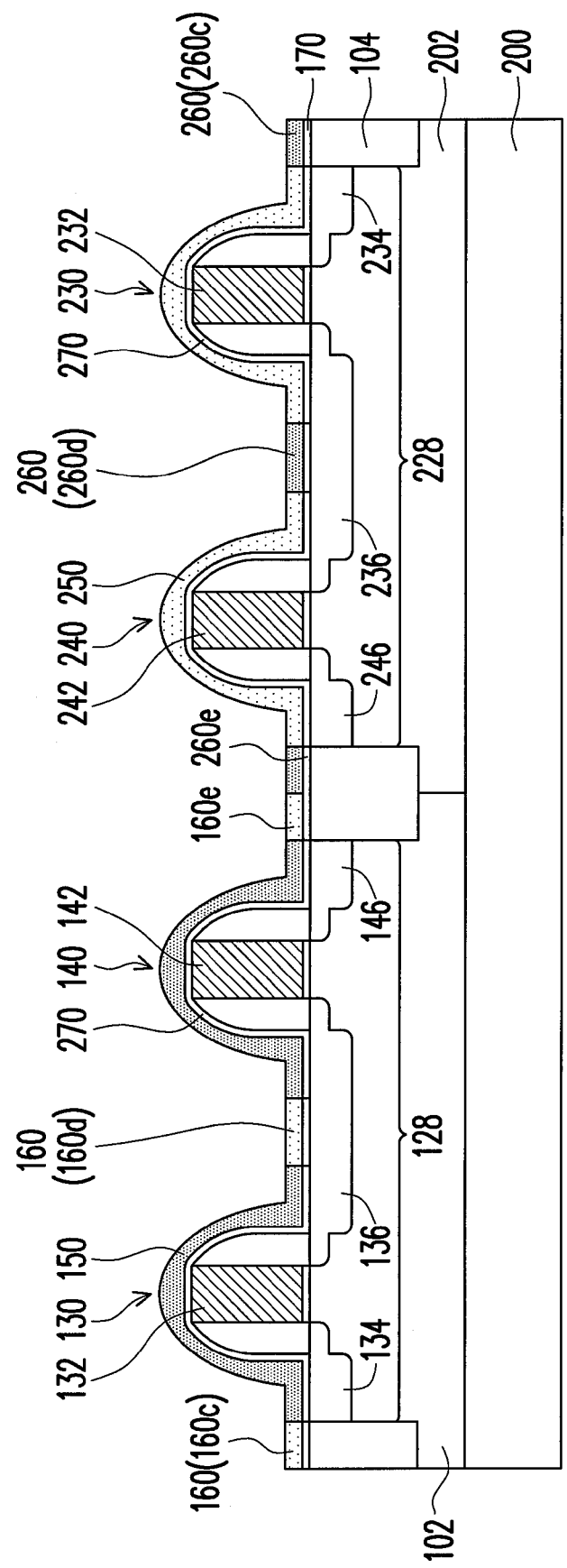
FIG. 8 is a schematic, cross-sectional diagram of FIG. 1, 2 or 3 along the line VIII-VIII.

FIG. 7 is a cross-sectional diagram of FIG. 2 along the cutting line IV-IV.

Referring to FIG. 7, in one embodiment, in accordance to the 65 nm design, the distance between the active region 108 and the active region 118 is about 0.11 micron; the width of the gate 112 or 212 is about 0.07 micron; the distance respectively between the contacts 190a, 190b, 190c, 190d and the junctions of the active regions 106a, 106b, 116a, 116b is about 0.015 micron; the distance respectively between the contacts 190a, 190b, 190c, 190d and the junctions of the gates 110 and 120 is about 0.055 micron; the dimension of the contact is about 0.09 micron X 0.09 micron.

Although in the above embodiments, the block-like or strip-like strain auxiliary layer 160 is used as exemplary illustration, the strain auxiliary layer 160 can also be ring shape under other allowable design rules in other embodiments.

Referring to FIG. 3, using the transistor 110 on the active region 108 as an illustrative example, the strain auxiliary layer having a ring-like configuration 106f encircle the periphery of the transistor 110. The ring-like configuration 160f is delineated along the source/drain regions 114, 116 of the transistor 110, extending along the sides 114a, 116a of the source/drain regions 114, 116 that are substantially parallel to the extension direction of the gate 112 to encircle the periphery of the transistor 110. In other words, the ring-like configuration 160f of the strain auxiliary layer 160 includes two sections 160a, 160b that are correspondingly configured above the isolation region 104 in proximity to the source/drain regions 114, 116 at the sides 114a, 116a that are substantially parallel to the extension direction of the gate 112, and connecting parts 160aa, 160bb that are configured above the isolation region 104 and are used to connect the two sections 160a and 160b.

Referring to FIG. 3, applying the transistors 130, 140 on the active region 128 as an exemplary illustration, the strain auxiliary layer 160 is a double ring 160g or an "8-shape" ring that encircles the transistors 130, 140. In other words, the double rings 160g is constituted with three sections 160c, 160d, 160e and connecting parts 160cc, 160dd. The sections 160c and 160e correspondingly configure above the isolation region 104 in proximity to the source/drain regions 134, 146 at the sides 134a, 146a that are substantially parallel to the extension direction of the gates 132, 142. The section 160d covers a part of the common source/drain region 136 of the transistors 130, 140. The connecting parts 160cc, 160dd are disposed above the isolation region 104 and are used to connect the three sections 160c, 160d, 160e.

Although the above embodiments herein refer to a block-like or strip-like or ring-like strain auxiliary layer 160, it is to be understood that these embodiments are presented by way of example and not by way of limitation. It should be appreciated that the strain auxiliary layer 160 may configure in any shape and falls within the spirit and scope of the invention so long as the compressive stress of compressive film layer 150 can be enhanced.

Referring to both FIGS. 2 and 4, in the p-type well region 202, an isolation structure 104 is used to define the active regions 208, 218, 228. The isolation structure 104 is, for example, a shallow trench isolation structure. The neighboring active regions 208 and 218, isolated by the isolation structure 104, respectively include transistors 210, 220 constructed thereon. Two neighboring transistors 230, 240 are formed on the active region 228.

Figure 6:
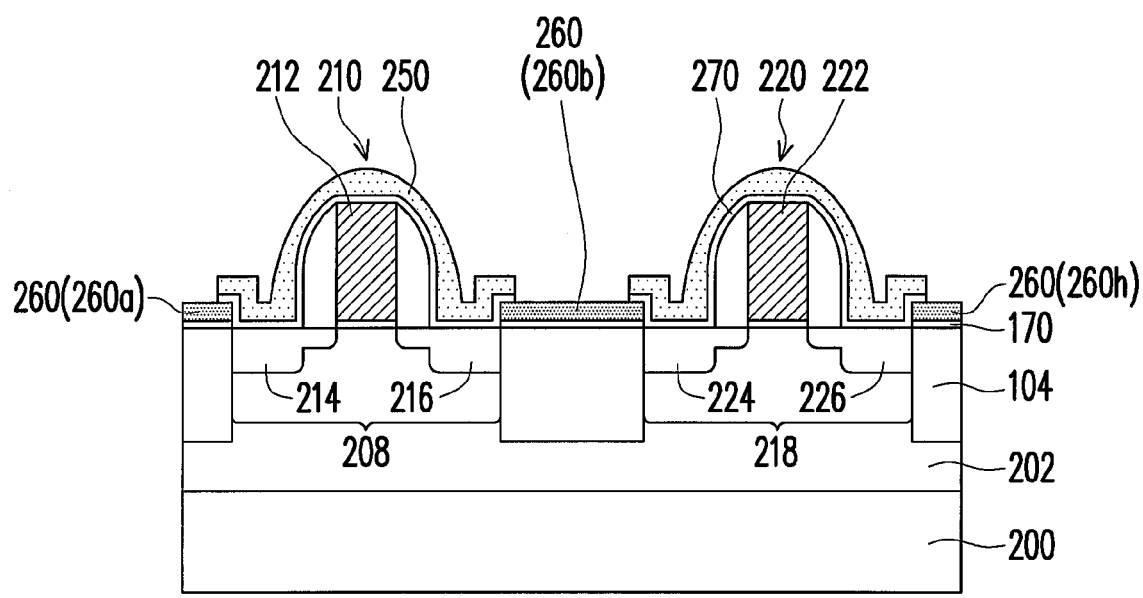
FIG. 6 is a schematic, cross-sectional diagram of FIG. 1, 2 or 3 along the line VI-VI.

Referring concurrently to FIGS. 2 and 6, the transistor 210 includes n-type channel metal oxide semiconductor transistor (NMOS). The transistor 210 includes a gate 212 and source/drain regions 214, 216. The gate is configured on the active region 208 and extends to the isolation region 104 at the periphery of the active region 208. The gate 212 is constructed with a gate dielectric layer and a gate conductive layer. The source/drain regions 214, 216 are configured in the active region 208 beside two sides of the gate 212. The source/drain regions 214, 216 are formed by n-type doped regions in the substrate 100, for example or by an n-type doped semiconductor compound layer.

Referring concurrently to FIGS. 2 and 6, the neighboring transistors 220 and 210 are configured on different active regions. The transistor 220 is, for example, an n-type channel metal oxide semiconductor transistor. The transistor 220 includes a gate 222 and source/drain regions 224, 226. The gate 222 is positioned on the active region 218 and extends to the isolation region 104 at the peripheral of the active region 218. The gate 222 is formed with a gate dielectric layer and a gate electrode. The source/drain regions 224, 226 are formed with an n-type doped region in the substrate 100, for example, or with a p-type doped semiconductor compound layer.

Referring to FIGS. 2 and 6 concurrently, the transistors 230, 240 are, for example, p-type channel metal oxide semiconductor transistors. The transistor 230 and the transistor 240 are configured on a same active region 228, sharing a common source/drain region 236. The transistor 230 includes a gate 232, a source/drain region 234 and the common source/drain region 236. The gate 232 is positioned on the active region 228 and extends to the isolation region 104 at the peripheral of the active region 218. The gate 232 is constituted with a gate dielectric layer and a gate conductive layer. The source/drain region 234 and the common source/drain region 236 are configured in the active region 228 beside two sides of the gate 232. The source/drain region 234 and the common source/drain region 236 are formed with an n-type doped region in the substrate 100, for example or with a p-type doped semiconductor compound layer.

Referring to FIGS. 2 and 6 concurrently, the transistor 240 includes a gate 242, a source/drain region 246 and the common source/drain region 236. The gate 242 is positioned on the active region 228 and extends to the isolation region 104 at the peripheral of the active region 228. The gate 242 is constituted with a gate dielectric layer and a gate conductive layer. The source/drain region 246 and the common source/drain region 236 are configured in the active region 228 beside two sides of the gate 242. The source/drain region 246 and the common source/drain region 236 are formed with an n-type doped region in the substrate 100, for example or with an n-type doped semiconductor compound layer.

Referring concurrently to FIGS. 2 and 6, the gate dielectric layer of each of the above transistors 210, 20, 230, 240 includes a silicon oxide layer or other dielectric material. The gate conductive layer is constructed with a doped polysilicon layer, for example, or with doped polysilicon and a silicide layer. The silicide layer includes heat tolerant metal such as, nickel, cobalt, titanium, copper, molybdenum, tantalum, tungsten, zirconium, platinum and alloys of these metals.

In one embodiment, the above source/drain regions 214, 216, 224, 226, 234, 246 and the common source/drain region 236 are p-type doped regions in the substrate 100, which are fabricated by, for example forming a patterned photoresist layer (not shown) over the substrate 100, followed by performing an ion implantation process. The dopants being implanted in the ion implantation process include p-type dopants, such as boron.

In another embodiment, the above source/drain regions 214, 216, 224, 226, 234, 236 and the common source/drain region 236 are n-type doped semiconductor compound layer formed in the substrate 100. The n-type doped semiconductor compound layer is fabricated by, for example, forming a patterned photoresist layer in the substrate 100, and removing the substrate 100 at two sides of the gates 212, 222, 232, 242 to form a pit (not shown), followed by performing a selective area epitaxy growth process to epitaxially grow a semiconductor compound layer in the pit and doping the semiconductor compound layer. The semiconductor compound includes silicon carbide. During the deposition, n-type dopants, for example, boron can be doped in-situ to form the source/drain regions 214, 216, 224, 226, 234, 246 and the common source/drain region 236.

In one embodiment, the above source/drain regions 214, 216, 224, 226, 234, 246 and the common source/drain region 236 further include metal silicide (not shown). The metal silicide layer includes heat tolerant metal such as, nickel, cobalt, titanium, copper, molybdenum, tantalum, tungsten, zirconium, platinum and alloys of these metals.

FIG. 6 is a schematic, cross-sectional diagram of FIG. 1, 2 or 3 along the line VI-VI.

Referring concurrently to FIGS. 2 and 6, the p-type well region 202 includes a tensile film layer 250 and a strain auxiliary layer 260. The tensile film layer 250 covers the transistors 210, 220, 230, 240 and a majority of the isolation structure 104 to provide a tensile stress to each transistor 210, 220, 230 and 240 to enhance the mobility of electrons and holes in the channel and to increase the operating speed of the transistor. The type of stress provided by the strain auxiliary layer 260 is different from that provided by the tensile film layer 250. The strain auxiliary layer 260 covers a small portion of the isolation structure 104 to increase the tensile stress provided by the tensile film layer 250. In one embodiment, the strain auxiliary layer 260 provides a type of stress opposite to that of the tensile film layer 250; for example, the strain auxiliary layer 260 is a compressive film layer, which can provide a compressive pull force to the tensile film layer 250 to enhance the tensile stress provided by the tensile film layer 250.

Referring to FIGS. 1 and 2, in one embodiment, using the transistor 210 on the active region 208 as an exemplary illustration, the strain auxiliary layer 260 includes two sections 260a, 260b, which are correspondingly disposed above the isolation region 104 in proximity to the source/drain regions 214, 216 at the sides 214a, 216a of the source/drain regions 214, 216 that are substantially parallel to the extension direction of the gates 232, 242. The two sections 260a, 260b of the strain auxiliary layer 260 may have block-like configurations disposed on the isolation region 104 near the source/drain regions 214, 216 as shown in FIG. 1, or long-strip configurations extending substantially parallel to the gate 212 as shown in FIG. 2. The compressive film layer 250 covers the transistor 210 and the isolation region 104 not covered by the strain auxiliary layers 260a, 260b. The two sections 260a, 260b of the strain auxiliary layer 260 can be designed into different sizes, shapes, and can be symmetrical or asymmetrical according the stress required by the entire device.

Referring to both FIGS. 1 and 2, using the transistors 230, 240 on the active region 228 as an exemplary illustration, the strain auxiliary layer 260 includes three sections 260c, 260d, 260e, wherein the sections of 260c and 260e are correspondingly disposed above the isolation region 104 in proximity to the source/drain regions 234, 246 at the sides 234a, 246a of the source/drain regions 234, 246 that are substantially parallel to the extension direction of the gates 232, 242. The section 260d covers a part of the commons source/drain region 236 of the transistors 230, 240. The tensile film layer 250 covers the gates 232, 242 of the transistors 230, 240, the source/drain regions 234, 246, a part of the common source/drain region 246 and the isolation region 104 not covered by the strain auxiliary layers 260c, 260d, 260e. The sections 260c and 260e may have block-like configurations disposed above the isolation region 140 near the source/drain regions 234, 246 as shown in FIG. 1, or long-strip configurations that extend substantially parallel to the gates 232, 242 as shown in FIG. 2. The section 260d may have a block-like configuration that covers a part of the common source/drain region 236 of the transistors 230, 240 as shown in FIG. 1, or a long-strip configuration that extends substantially parallel to the gates 232, 242 as shown in FIG. 2. The three sections of the strain auxiliary layer 260 can be designed into various sizes, shapes, and can be symmetrical or asymmetrical according the stress required by the entire device.

Although in the above embodiments, the block-like or strip-like strain auxiliary layer 260 is used as exemplary illustration, the strain auxiliary layer 260 can also be ring shape under other allowable design rules in other embodiments.

Referring to FIG. 3, using the transistor 210 on the active region 208 as an illustrative example, the strain auxiliary layer having a ring-like configuration 260f encircles the periphery of the transistor 210. The ring-like configuration 260f of the strain auxiliary layer delineates along the source/drain regions 214, 216 of the periphery of the transistor 210, extending along the sides 214a, 216a of the source/drain regions 214, 216 that are substantially parallel to the extension direction of the gate 112. In other words, the ring-like configuration 260f includes the two sections 260a, 260b that are correspondingly configured above the isolation region 104 in proximity to the source/drain regions 214, 216 at the sides 214a, 216a that are substantially parallel to the extension direction of the gate 212, and connecting parts 260aa, 260bb that are configured above the isolation region 104 and used to connect the two sections 260a and 260b.

Referring to FIG. 3, applying the transistors 230, 240 on the active region 228 as an exemplary illustration, the strain auxiliary layer 260 is a double ring 260g or an "8-shape" ring that encircles the transistors 230, 240. In other words, the double rings 260g is constituted with three sections 260c, 260d, 260e and connecting parts 260cc, 260dd. The sections 260c and 260e configure correspondingly above the isolation region 104 in proximity to the source/drain regions 234, 246 at the sides 234a, 246a that are substantially parallel to the extension direction of the gates 232, 242. The section 260d covers a part of the common source/drain region 236 of the transistors 230, 240. The connecting parts 260cc, 260dd are disposed above the isolation region 104 and are used to connect the three sections 260c, 260d, 260e.

Although above embodiments herein refers to a block-like or strip-like or ring-like strain auxiliary layer 260, it is to be understood that these embodiments are presented by way of example and not by way of limitation. It should be appreciated that the strain auxiliary layer 260 may configure in any shape and falls within the spirit and scope of the invention so long as the compressive stress of compressive film layer 250 can be enhanced.

In the n-type well region 102, the sizes and shapes of the various sections of the strain auxiliary layer 160 may be different or the same. In the p-type well region 202, the sizes and shapes of the various sections of the strain auxiliary layer 260 may be different or the same. Further, the sizes and shapes of the various sections of the strain auxiliary layer 160 may be the same or different from the sizes and shapes of the various sections of the strain auxiliary layer 260.

Further, in one embodiment as shown in FIG. 4, each section of the strain auxiliary layer 160 in the n-type well region 102 is contiguous to the compressive film layer 150; each section of the strain auxiliary layer 260 in the p-type well region 202 is contiguous to the tensile film layer 250. In another embodiment as shown in FIG. 5, each section of the strain auxiliary layer 160 in the n-type well region 102 overlaps with the compressive film layer 150; each section of the strain auxiliary layer 260 in the p-type well region 202 overlaps with the tensile film layer 250.

When the strain auxiliary layer 160 in the n-type well region 102 is a tensile film layer and the strain auxiliary layer 260 in the p-type well region 202 is a compressive film layer, the strain auxiliary layer 160 in the n-type well region 102 may concurrently form with the tensile film layer 250 in the p-type well region 202 under a single deposition process and a single lithograph process.

Figure 5:
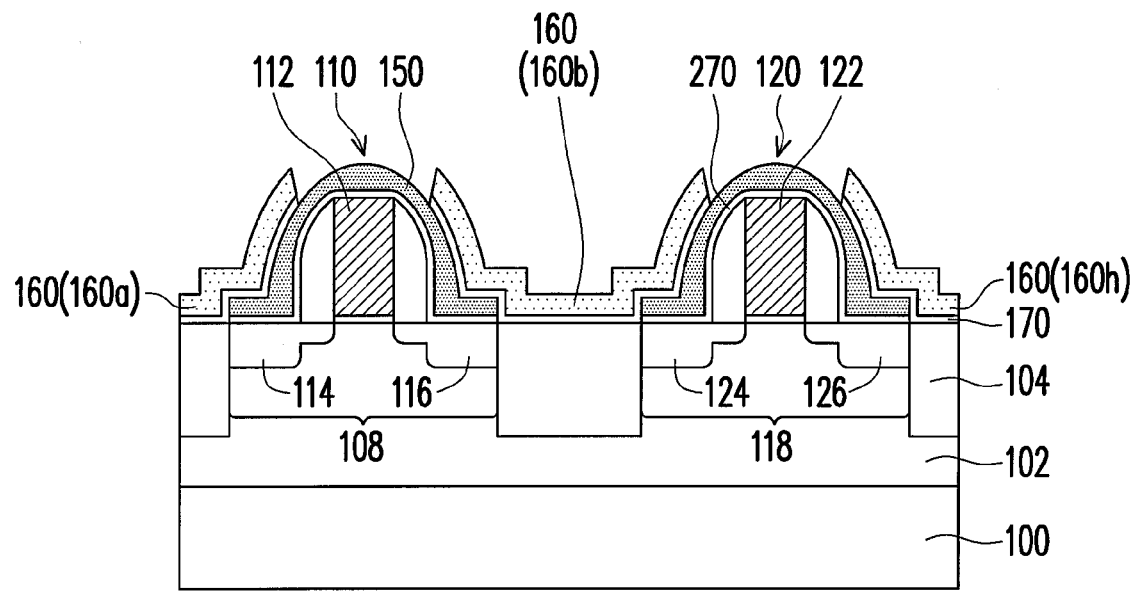
FIG. 5 is a schematic, cross-sectional diagram of FIG. 1, 2 or 3 along the line IV-IV.

FIG. 5 is a cross-sectional view diagram of FIG. 2 along the cutting lines IV-IV. FIG. 6 is a cross-sectional view diagram of FIG. 2 along the cutting lines VI-VI.

In one embodiment, referring to both FIGS. 5 & 6, the compressive film layer 150 in the n-type well region 102 and the strain auxiliary layer 260 in the p-type well region are formed before the tensile film layer 250 in the p-type well region 202 and the strain auxiliary layer 160 in the n-type well region. In another embodiment, the compressive film layer 150 in the n-type well region 102 and the strain auxiliary layer 260 in the p-type well region 202 are formed after the tensile film layer 250 in the p-type well region 202 and the strain auxiliary layer 160 in the n-type well region 102.

Referring to FIGS. 5 and 6, the materials that constitute the strain auxiliary layer 160 in the n-type well region 102 and the tensile film layer 260 in the p-type well region 202 include a silicon nitride layer having tensile characteristics. The materials that constitute the strain auxiliary layer 260 in the p-type well region 202 and the compressive film layer 150 in the n-type well region 202 include a silicon nitride layer having compressive characteristics. When both cases are silicon nitride layer, silicon oxide layers 170, 270 are respectively formed before forming each silicon nitride layer. The first layer of the silicon oxide layer 170 may serve as a pad oxide layer between the silicon nitride layer and the substrate 100 to obviate a significant differentiation of stress between the silicon nitride layer and the substrate. Further, the second layer of the silicon oxide layer 270 may serve as an etch stop layer of the second layer of silicon nitride layer.

In accordance to the present invention, besides forming a strain layer at the periphery of the transistor, a strain auxiliary layer is also formed to enhance the stress that can be provided by the strain layer. Hence, the local mechanical stress is effectively increased to enhance the driving current and to improve of the efficiency of the device.

In accordance to the embodiments of the present invention, the tensile film layer on the NMOS device region may concurrently formed with the strain auxiliary layer on the PMOS device region. Further, the compressive film layer on the PMOS device region and the strain auxiliary layer on the NMOS device region may concurrently formed. Hence, the numbers of photomasks used in the present invention is the same as that being used conventionally in depositing a single layer of tensile film layer and a compressive film layer respectively on the NMOS device region and the PMOS device region. Accordingly, local mechanical stress can be effectively increased without complicating the fabrication process.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device comprising:
   a well region in a substrate;
   a transistor, configured on a the substrate;
   a strain auxiliary layer, disposed on the substrate and above the well region at a periphery of the transistor besides and directly connecting source/drain regions of the transistor, wherein the strain auxiliary layer has a top surface lower than a top surface of a contact directly connected to the source/drain regions of the transistor; and
   a strain layer, disposed on the same substrate and above the same well region, covering the transistor and the well region at a center of the transistor not covered by the strain auxiliary layer, wherein a stress provided by the strain layer is different from a stress provided by the strain auxiliary layer.

2. The semiconductor device according to claim 1, wherein the strain auxiliary comprises two sections, correspondingly disposed on the substrate at the periphery of the transistor.

3. The semiconductor device according to claim 2, wherein the two sections of the strain auxiliary layer are configured above a part of an isolation region.

4. The semiconductor device according to claim 3, wherein the two sections of the strain auxiliary layer are respectively configured in proximity to two source/drain regions of the transistor.

5. The semiconductor device according to claim 4, wherein the two sections of the strain auxiliary layer are correspondingly respectively delineated at one side of each source/drain region of the transistor, wherein the one side of each source/drain region is substantially parallel to an extension direction of a gate of the transistor.

6. The semiconductor device according to claim 2, wherein one of the two sections of the strain auxiliary layer covers a part of a common source/drain region of the transistor and another one of the two sections of the strain auxiliary layer is disposed over a part of an isolation structure in the substrate.

7. The semiconductor device according to claim 6, wherein the other one of the two sections of the strain auxiliary layer is delineated extending along one side of a source/drain region of the transistor, wherein the one side of the source/drain region is substantially parallel to an extension direction of a gate of the transistor.

8. The semiconductor device according to claim 2, wherein the strain auxiliary layer having a ring-like configuration that encircles a periphery of the transistor, the ring-like configuration of the auxiliary layer comprising:
   the two sections; and
   two connecting parts to connect the two sections.

9. The semiconductor device according to claim 8, wherein the two sections of the ring-like configuration extend along one side of a source/drain region of the transistor, wherein the one side of the source/drain region is substantially parallel to an extension direction of a gate of the transistor.

10. The semiconductor device according to claim 1, wherein the strain layer and the strain auxiliary layer provide opposite types of stress.

11. The semiconductor device according to claim 10, wherein the transistor is an N-type channel metal oxide semiconductor transistor, and the strain auxiliary layer is a tensile film layer, while the strain layer is a compressive film layer.

12. The semiconductor device according to claim 10, wherein the transistor is a P-type channel metal oxide semiconductor transistor, and the strain auxiliary layer is a compressive film layer, while the strain layer is a tensile film layer.

13. A semiconductor device, comprising:
   a substrate, comprising a first conductive type well region and a second conductive type well region;
   a first conductive type metal oxide semiconductor transistor, configured on the substrate within the boundary of the second conductive type well region;
   a second conductive type metal oxide semiconductor transistor, configured on the substrate within the boundary the first conductive type well region;
   a first strain layer, disposed on the substrate and above a part of the first conductive type well region at a center of the first conductive type metal oxide semiconductor transistor and a part of the second conductive type well region at a periphery of the second conductive channel metal oxide semiconductor transistor, wherein the periphery of the second conductive channel metal oxide semiconductor transistor besides and directly connected to source/drain regions of the second conductive channel metal oxide semiconductor transistor; and
   a second strain layer, disposed on the substrate and above another part of the first conductive well region at a periphery of the first conductive type metal oxide semiconductor transistor not covered by the first strain layer and another part of the second conductive well region at a center of the second conductive channel metal oxide semiconductor transistor not covered by the first strain layer, wherein the periphery of the first conductive channel metal oxide semiconductor transistor besides and directly connecting source/drain regions of the first conductive channel metal oxide semiconductor transistor, and wherein a stress provided by the second strain layer is different from a stress provided by the first strain layer, and a top surface of the first strain layer and a top surface of the second strain layer are lower a top surface of a contact directly connected to one of source/drain regions of the first conductive channel metal oxide semiconductor transistor or the second conductive channel metal oxide semiconductor transistor.

14. The semiconductor device of claim 13, wherein the stress provided by the second strain layer is opposite to the stress provided by the first strain layer.

15. The semiconductor device of claim 14, wherein the first conductive type includes an N-type, while the second conductive type includes a P-type.

16. The semiconductor device of claim 14, wherein the first strain layer includes a tensile film layer, while the second strain layer includes compressive film layer.

17. The semiconductor device of claim 13, wherein the first strain layer configured on part of the first conductive type well region includes two sections, correspondingly disposed on the substrate.

18. The semiconductor device of claim 17, wherein the two sections of the first strain layer are disposed on the part of the isolation region in the substrate.

19. The semiconductor device of claim 18, wherein the two sections of the first strain layer are configured respectively in proximity to two source/drain regions of the first conductive type channel metal oxide semiconductor transistor.

20. The semiconductor device of claim 19, wherein the two sections of the first strain layer are correspondingly respectively disposed at one side of each source/drain regions of the first conductive type channel metal oxide semiconductor transistor, wherein the one side of each source/drain regions is substantially parallel to an extension direction of a gate of the first conductive type channel metal oxide semiconductor transistor.

21. The semiconductor device of claim 17, wherein one of the two sections of the first strain layer covers a part of a common source/drain region of the first conductive type channel metal oxide transistor, and another one of the two sections of the first strain layer is configured on the part of the isolation region in the substrate.

22. The semiconductor device of claim 17, wherein the first strain layer disposed on the second conductive type well region has a ring-like configuration encircling a periphery of the transistor, wherein the ring-like configuration comprises:
the two sections; and
two connecting parts to connect the two sections.

23. The semiconductor device of claim 13, wherein the second strain layer on the other part of the first conductive type well region comprises two sections correspondingly disposed on the substrate.

24. The semiconductor device of claim 23, wherein the two sections of the second strain layer are respectively disposed on the part of the isolation region of the substrate.

25. The semiconductor device of claim 24, wherein the two sections of the second strain layer are respectively disposed in proximity to two source/drain regions of the second conductive type channel metal oxide semiconductor transistor.

26. The semiconductor device of claim 25, wherein the two sections of the second strain layer correspondingly respectively dispose at one side of each source/drain regions of the second conductive type channel metal oxide semiconductor transistor, wherein the one side of each source/drain regions is substantially parallel to an extension direction of a gate of the second conductive type channel metal oxide semiconductor transistor.

27. The semiconductor device of claim 23, wherein one of the two sections of the second strain layer covers a part of one common source/drain region of the second conductive type channel metal oxide transistor, and another one of the two sections of the second strain layer is configured on the part of a isolation region in the substrate.

28. The semiconductor device of claim 23, wherein the second strain layer disposed on the first conductive type well region has a ring-like configuration encircling a periphery of the second conductive type channel metal oxide transistor, wherein the ring-like configuration comprises:
the two sections; and
two connecting parts to connect the two sections.

* * * * *